(12) United States Patent
Millward et al.

(10) Patent No.: US 8,696,918 B2
(45) Date of Patent: Apr. 15, 2014

(54) METHODS OF UTILIZING BLOCK COPOLYMER TO FORM PATTERNS

(75) Inventors: Dan Millward, Boise, ID (US); Scott Sills, Boise, ID (US)

(73) Assignee: Micron Technology, Inc., Boise, ID (US)

(*) Notice: Subject to any disclaimer, the term of this patent is extended or adjusted under 35 U.S.C. 154(b) by 382 days.

(21) Appl. No.: 12/774,581

(22) Filed: May 5, 2010

(65) Prior Publication Data

US 2011/0272381 A1 Nov. 10, 2011

(51) Int. Cl.
*B44C 1/22* (2006.01)

(52) U.S. Cl.
USPC ............... 216/37; 216/83; 438/106; 438/303; 438/315; 438/330; 438/672

(58) Field of Classification Search
USPC .............. 216/37, 83; 438/106, 303, 315, 330, 438/672, 725
See application file for complete search history.

(56) References Cited

U.S. PATENT DOCUMENTS

| | | | |
|---|---|---|---|
| 7,347,953 B2 | 3/2008 | Black et al. | |
| 7,569,469 B2 | 8/2009 | Kim et al. | |
| 7,605,081 B2 | 10/2009 | Yang et al. | |
| 2007/0175859 A1* | 8/2007 | Black et al. | 216/41 |
| 2008/0311402 A1 | 12/2008 | Jung et al. | |
| 2009/0035668 A1 | 2/2009 | Breyta et al. | |
| 2009/0092803 A1* | 4/2009 | Bita et al. | 428/209 |
| 2009/0179194 A1 | 7/2009 | Wu et al. | |
| 2009/0205713 A1 | 8/2009 | Mitra et al. | |
| 2009/0212016 A1 | 8/2009 | Cheng et al. | |
| 2009/0236309 A1 | 9/2009 | Millward et al. | |

OTHER PUBLICATIONS

Xu et al. Advanced Materials, vol. 22, (2010),pp. 2268-2272.*
Segalman R. Materials Science and Engineering, R 48, (2005) pp. 191-226.*
Hammond et al. Macromolecules, vol. 38, (2005), pp. 6575-6585.*
Yun et al. Chemical Materials, vol. 18, (2006), pp. 5646-5648.*
Van Zoelen et al., "Phase Behavior of Solvent Vapor Annealed Thin Films of PS-b-P4VP(PDP) Supramolecules", Macromolecules Apr. 18, 2008, 41, 3199-3208.
Ramanathan et al., "Thickness dependent hierarchical meso/nano scale morphologies of a metal-containing block copolymer this film induced by hybrid annealing and their pattern transfer abilities", Soft Matter, Aug. 10, 2009, 14 pages.

(Continued)

*Primary Examiner* — Lan Vinh
*Assistant Examiner* — Maki Angadi
(74) *Attorney, Agent, or Firm* — Wells St. John P.S.

(57) ABSTRACT

Some embodiments include methods of forming patterns. A block copolymer film may be formed over a substrate, with the block copolymer having an intrinsic glass transition temperature ($T_{g,O}$) and a degradation temperature ($T_d$). A temperature window may be defined to correspond to temperatures (T) within the range of $T_{g,O} \leq T \leq T_d$. While the block copolymer is in the upper half of the temperature window, solvent may be dispersed into the block copolymer to a process volume fraction that induces self-assembly of the block copolymer into a pattern. A defect specification may be defined, and the process volume fraction of solvent may be at level that achieves self-assembly within the defect specification. In some embodiments, the solvent may be removed from within the block copolymer while maintaining the defect specification.

27 Claims, 15 Drawing Sheets

(56) References Cited

OTHER PUBLICATIONS

Treossi et al., "Temperature-Enhanced Solvent Vapor Annealing of a C3 Symmetric Hexa-peri-Hexabenzocoronene: Controlling the Self-Assembly from Nano- to Macroscale", Small 2009, 5, No. 1, 112-119.

Hideaki Yokoyama, "Diffusion of block copolymers", Materials Science and Engineering R (2006), doi:10.1016/j.mser.2006.01.001, 50 pages.

Hashimoto et al., "Ordered Structure in Block Polymer Solutions. 4. Scaling Rules on Size of Fluctuations with Block Molecular Weight, Concentration, and Temperature in Segregation and Homogeneous Regimes", Macromolecules 1983, 16, 1093-1101.

Jung et al., "Solvent-Vapor-Induced Tunability of Self-Assembled Block Copolymer Patterns", Advanced Materials, 2009, 21, 2540-2545.

Hammond et al., "Temperature Dependence of Order, Disorder, and Defects in Laterally Confined Diblock Copolymer Cylinder Monolayers", Macromolecules Jul. 1, 2005, 38, 6575-6585.

Jung et al., "Orientation-Controlled Self-Assembled Nanolithography Using a Polystyrene-Polydimethylsiloxane Block Copolymer", Nano Letters Jun. 15, 2007, vol. 0, No. 0, A-E.

Park et al., "Fabrication of Highly Ordered Silicon Oxide Dots and Stripes from Block Copolymer Thin Films", Advanced Materials 2008, 20, 681-685.

\* cited by examiner

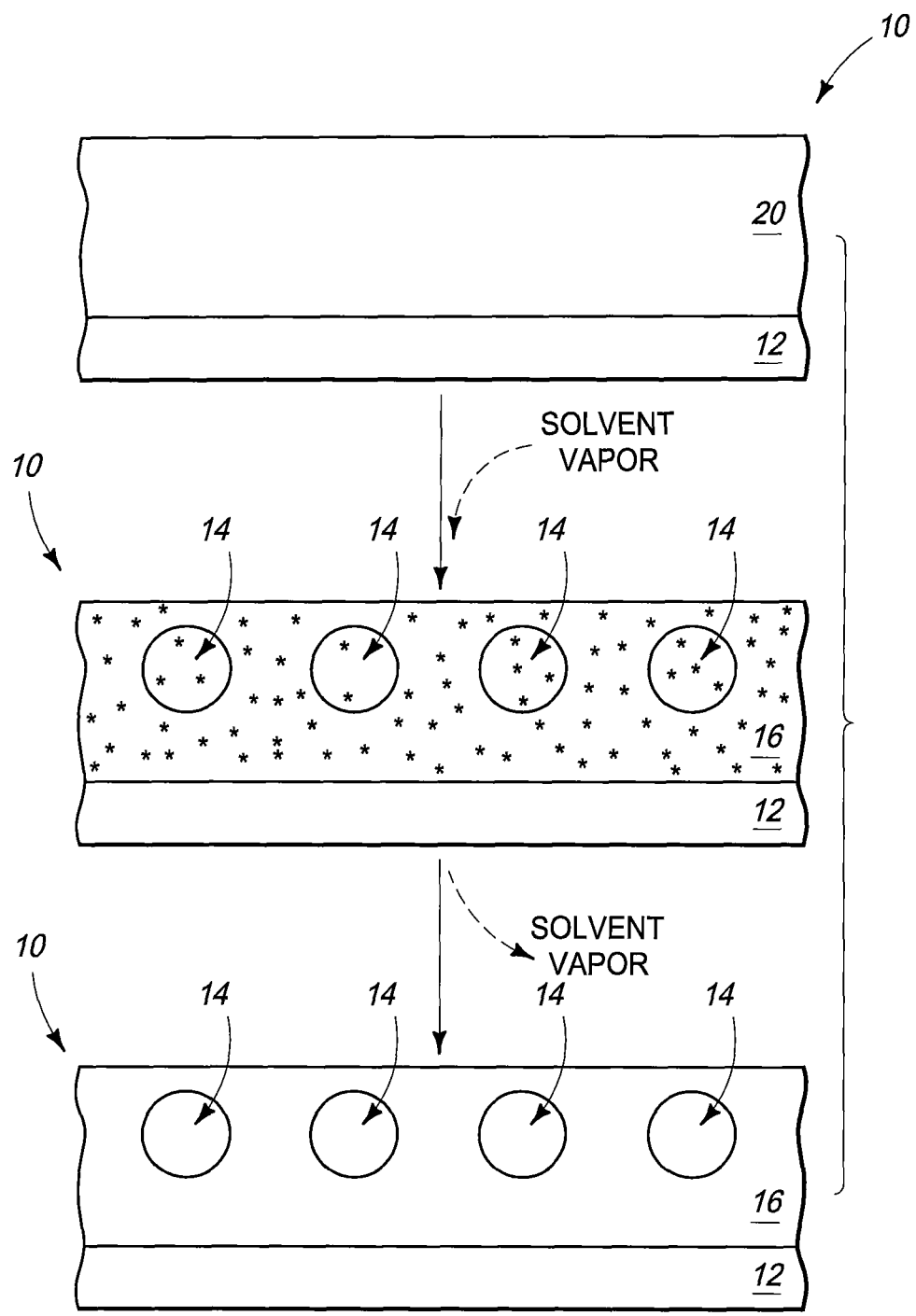

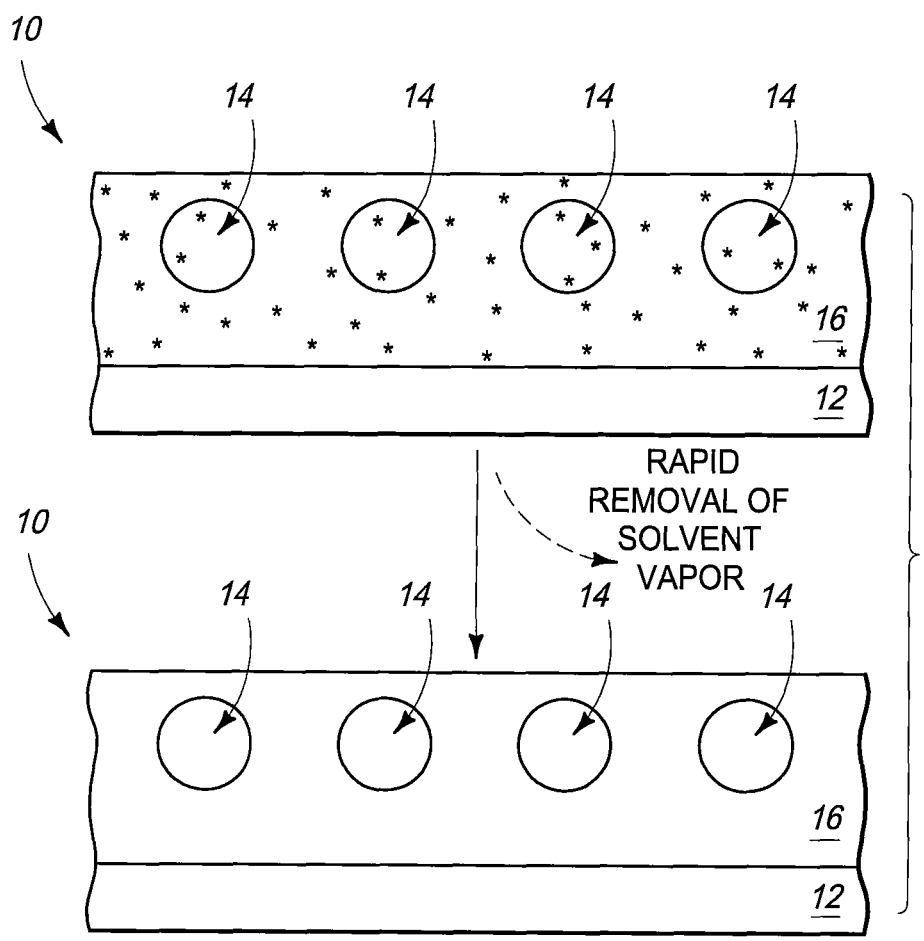

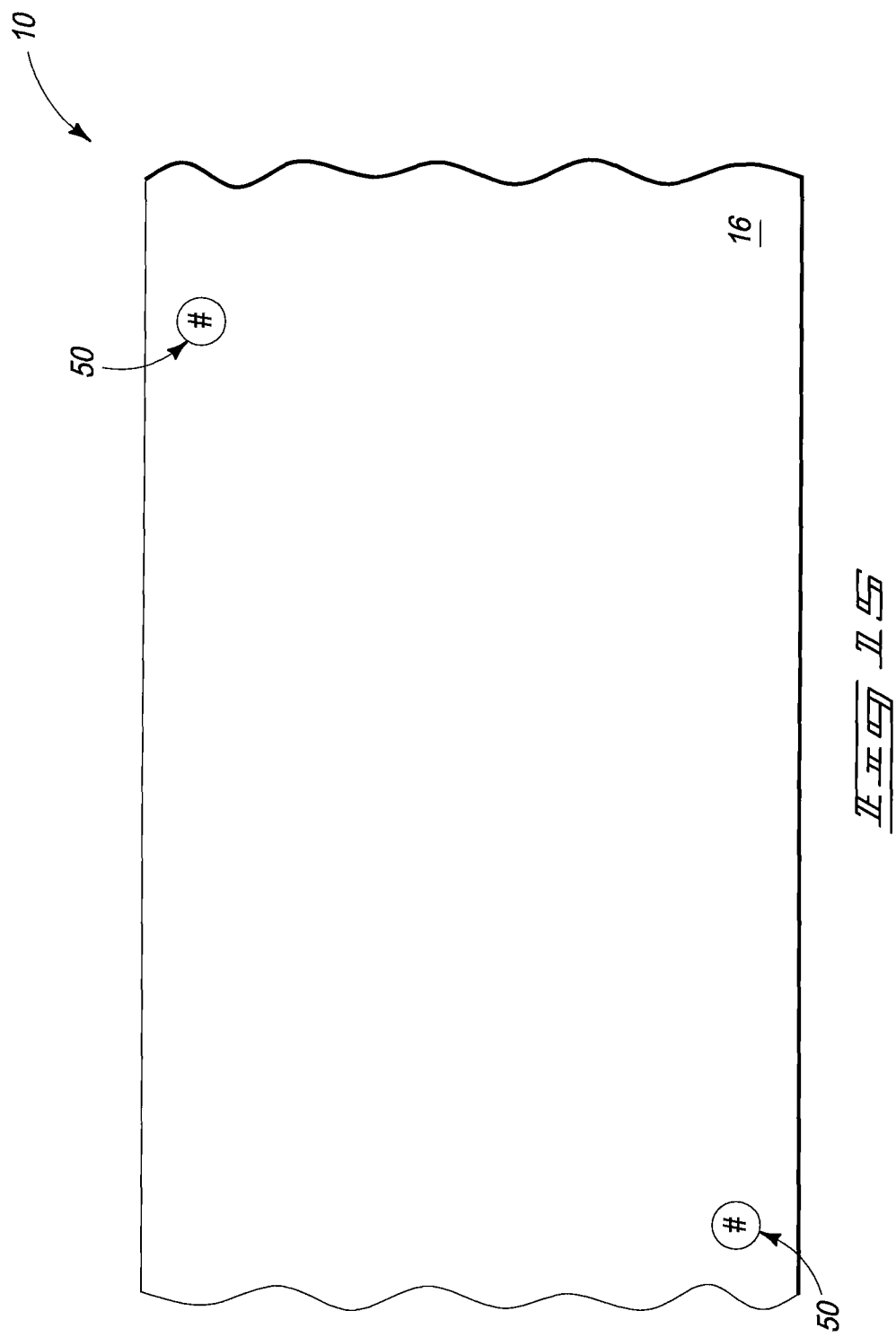

US 8,696,918 B2

METHODS OF UTILIZING BLOCK COPOLYMER TO FORM PATTERNS

TECHNICAL FIELD

Methods of utilizing block copolymer to form patterns.

BACKGROUND

Numerous applications exist in which it is desired to form repeating patterns having a small pitch (for example, a pitch of less than about 50 nanometers). For instance, integrated circuit fabrication may involve formation of a repeating pattern of memory-storage units (e.g., NAND unit cells, dynamic random access memory [DRAM] unit cells, cross-point memory unit cells, etc.).

A variety of methods have been developed for creating patterned masks suitable for patterning underlying materials during fabrication of integrated circuit components. A continuing goal of integrated circuit fabrication is to increase integrated circuit density, and accordingly to decrease the size of individual integrated circuit components. There is thus a continuing goal to form patterned masks having increasing densities of various patterned features.

A method showing some promise for creating repeating patterns to high density involves utilization of block copolymer to form the repeating patterns. Unfortunately, there are often numerous defects present in the repeating patterns formed with block copolymers. It would be desirable to develop new methods of forming patterns with block copolymers which enable repeating patterns to be formed to high density, and with fewer defects than are presently formed with conventional methods.

BRIEF DESCRIPTION OF THE DRAWINGS

FIG. 7 diagrammatically illustrates solvent treatment of block copolymer to induce self-assembly within the block copolymer.

FIG. 14 diagrammatically illustrates another example embodiment process for removing solvent from an assembled block copolymer.

FIG. 15 diagrammatically illustrates a top view of an example construction treated in accordance with the embodiment of FIG. 14.

DETAILED DESCRIPTION OF THE ILLUSTRATED EMBODIMENTS

Block copolymers are polymers derived from two or more monomeric species, and contain two or more homopolymer subunits linked by covalent bonds. The union of the homopolymer subunits may utilize an intermediate linkage known as a junction block.

Block copolymers may be in the form of diblock copolymers, triblock copolymers, etc. Example diblock copolymers include polystyrene-b-poly (2-vinylpyridine) (PS-b-P2VP); polystyrene-b-poly(ethylene oxide) (PS-b-PEO); polystyrene-b-poly(methylmethacrylate) (PS-b-PMMA); and polystyrene-b-poly(dimethyl-siloxane) (PS-b-PDMS). The "b" utilized in each of the above chemical formulas indicates a block linkage. Other example block copolymers include materials discussed in U.S. Patent Publication No. 2007/0293041. Diblock copolymers may be generically represented as A-B, where the "A" represents one of the homopolymer subunits, the "B" represents the other of the homopolymer subunits, and the hyphen represents a covalent bond or bonds linking to a junction block.

A useful property of some block copolymers is that the homopolymer subunits of the copolymers preferentially interact with like subunits, and avoid interactions with dissimilar subunits. For instance, in some diblock copolymers (A-B), the subunits A preferentially interact with other A, the subunits B preferentially interact with other B, and the subunits A and B preferentially avoid interactions with one another. The copolymers may thus self-assemble into repeating patterns. For instance, some copolymers may self-assemble into a repeating pattern that may be represented as A-B:B-A:A-B:B-A:A-B. In such pattern, the hyphens represent covalent bonds and the colons represent non-covalent interactions.

Figure 1:
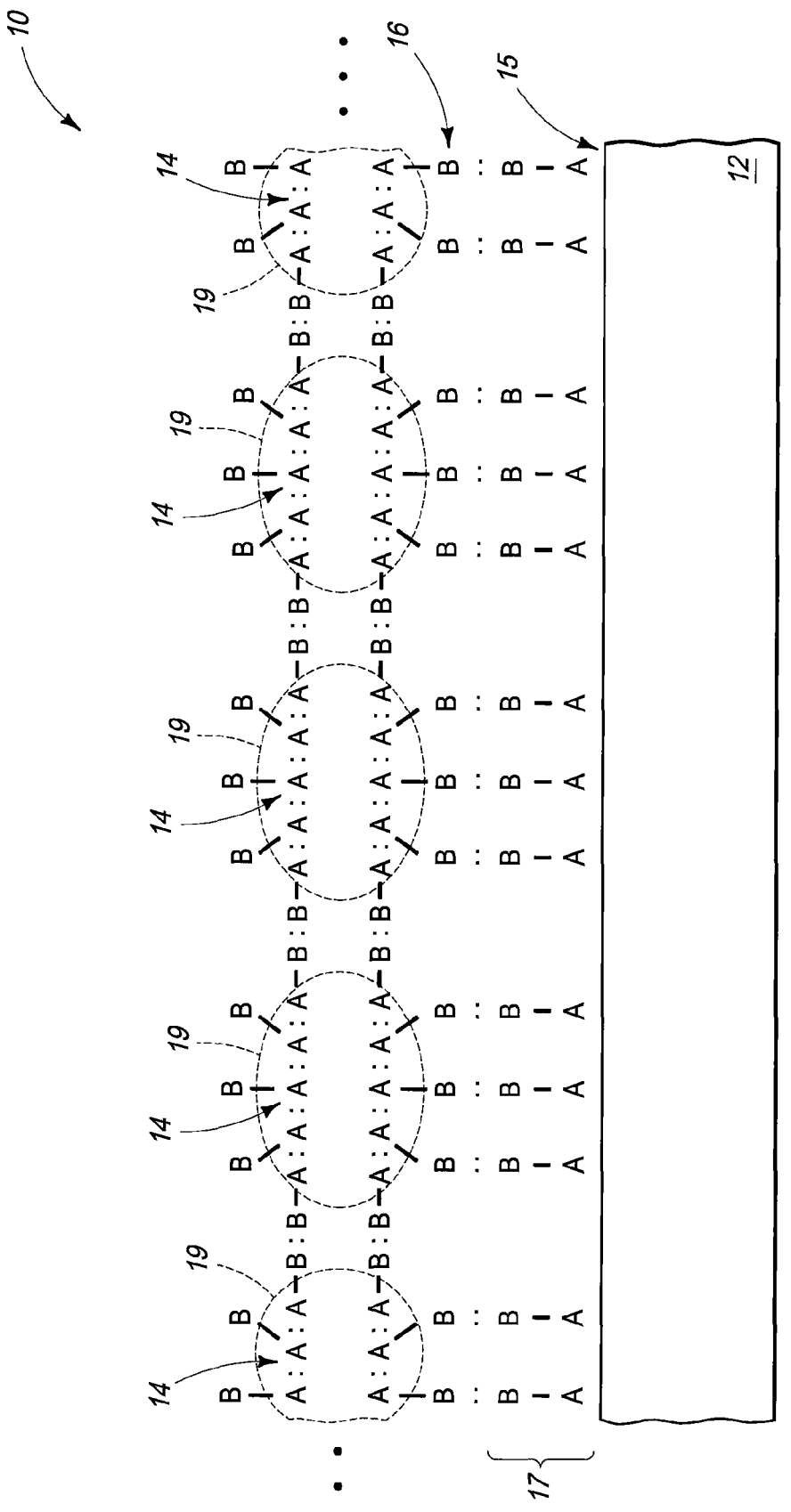
FIG. 1 is a diagrammatic representation of a pattern formed with self-assembly of diblock copolymer.

FIG. 1 shows a construction 10 comprising a substrate 12 having a diblock copolymer pattern extending thereover.

Substrate 12 may comprise, for example, a monocrystalline semiconductor wafer (for example, a monocrystalline silicon wafer), either alone or in assemblies with other materials. The terms "semiconductive substrate" and "semiconductor substrate" mean any constructions comprising semiconductive material, including, but not limited to, bulk semiconductive materials such as semiconductive wafers (either alone or in assemblies comprising other materials thereon), and semiconductive material layers (either alone or in assemblies comprising other materials). The term "substrate" means any supporting structure, including, but not limited to, semiconductive substrates.

The substrate 12 has an upper surface 15 to which subunit A of the diblock copolymer has more affinity than does subunit B of the copolymer, (for instance, surface 15 may be more wettable by subunit A than by subunit B). Accordingly, the diblock copolymer orients so that subunits A are directed toward surface 15. The first layer of A-B copolymer along surface 15 may be referred to as a brush layer 17. Additional levels of A-B copolymer are formed over the brush layer, and self-assembly of the copolymer may be induced by various conditions (with example conditions utilizing one or both of thermal treatment and solvent treatment, as discussed in more detail below).

The self-assembly has formed a pattern comprising two different domains. One of the domains corresponds to features 14 of A subunits (demarcated by dashed lines 19 in FIG. 1), and the other of the domains corresponds to a surrounding region 16 of B subunits. The features 14 may be cylinders or micelles. For instance, the features may be cylinders that extend parallel to the surface 15 of substrate 12, and that extend in and out of the page relative to the cross-sectional view of FIG. 1. Alternatively, the features 14 may be micelles, such as spherical micelles, arranged in a two-dimensional array across the surface 15 of substrate 12. In some embodiments, the features 14 may be formed in registration to lithographically-formed structures, and may be used to effectively multiply the pitch density of such structures.

Although the surrounding region 16 is shown to be the B subunits and the features 14 are shown to be the A subunits, in other embodiments the pattern may be reversed so that the surrounding region 16 contains the A subunits and the features 14 contain the B subunits.

Figure 2:
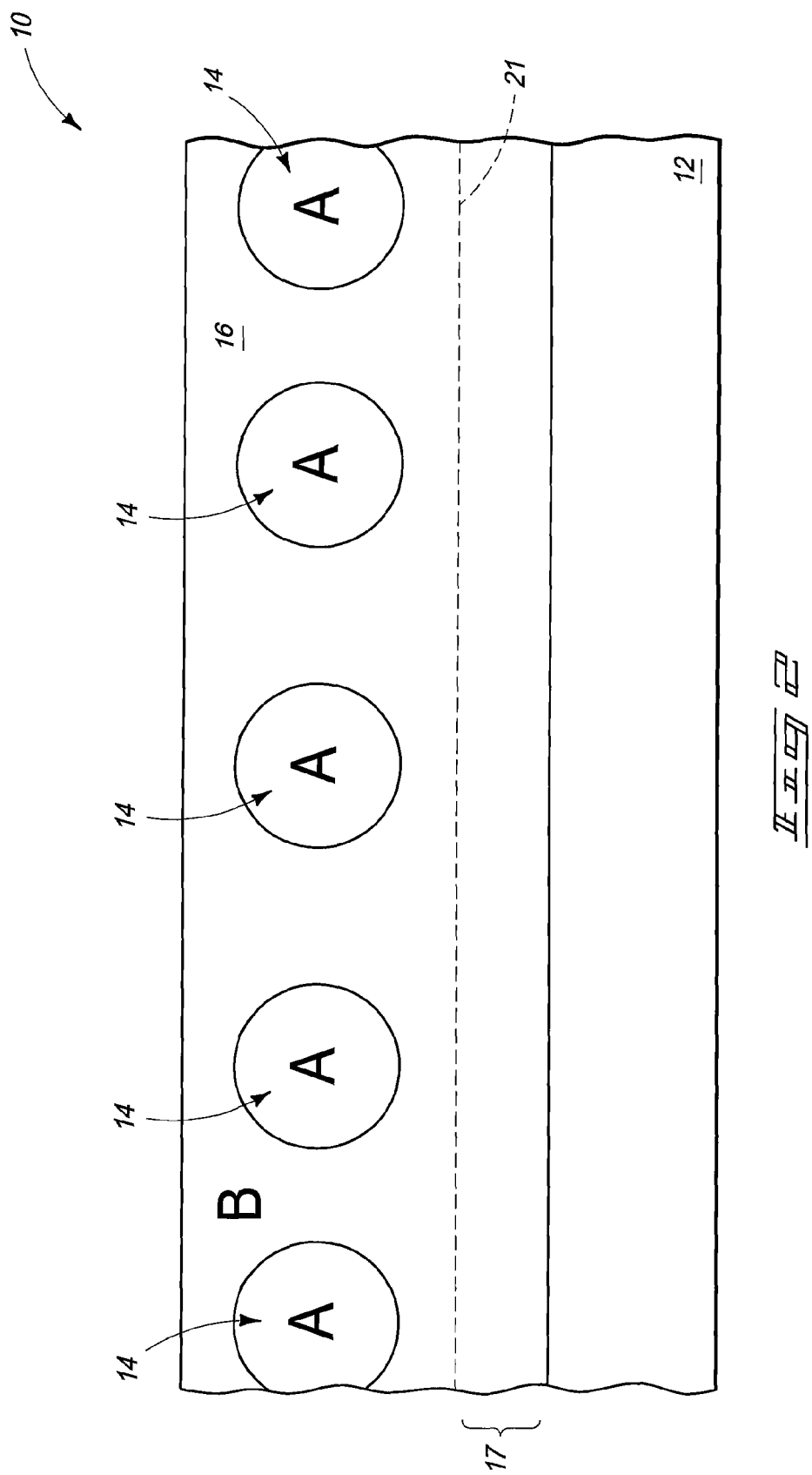
FIG. 2 is another diagrammatic representation of the pattern shown in FIG. 1.

The pattern of FIG. 1 may be diagrammatically represented with the simplified drawing shown in FIG. 2. A boundary between the brush layer 17 and the B subunit region 16 is represented with a dashed line 21 in FIG. 2. The features 14 form a monolayer over substrate 12.

Figure 3:
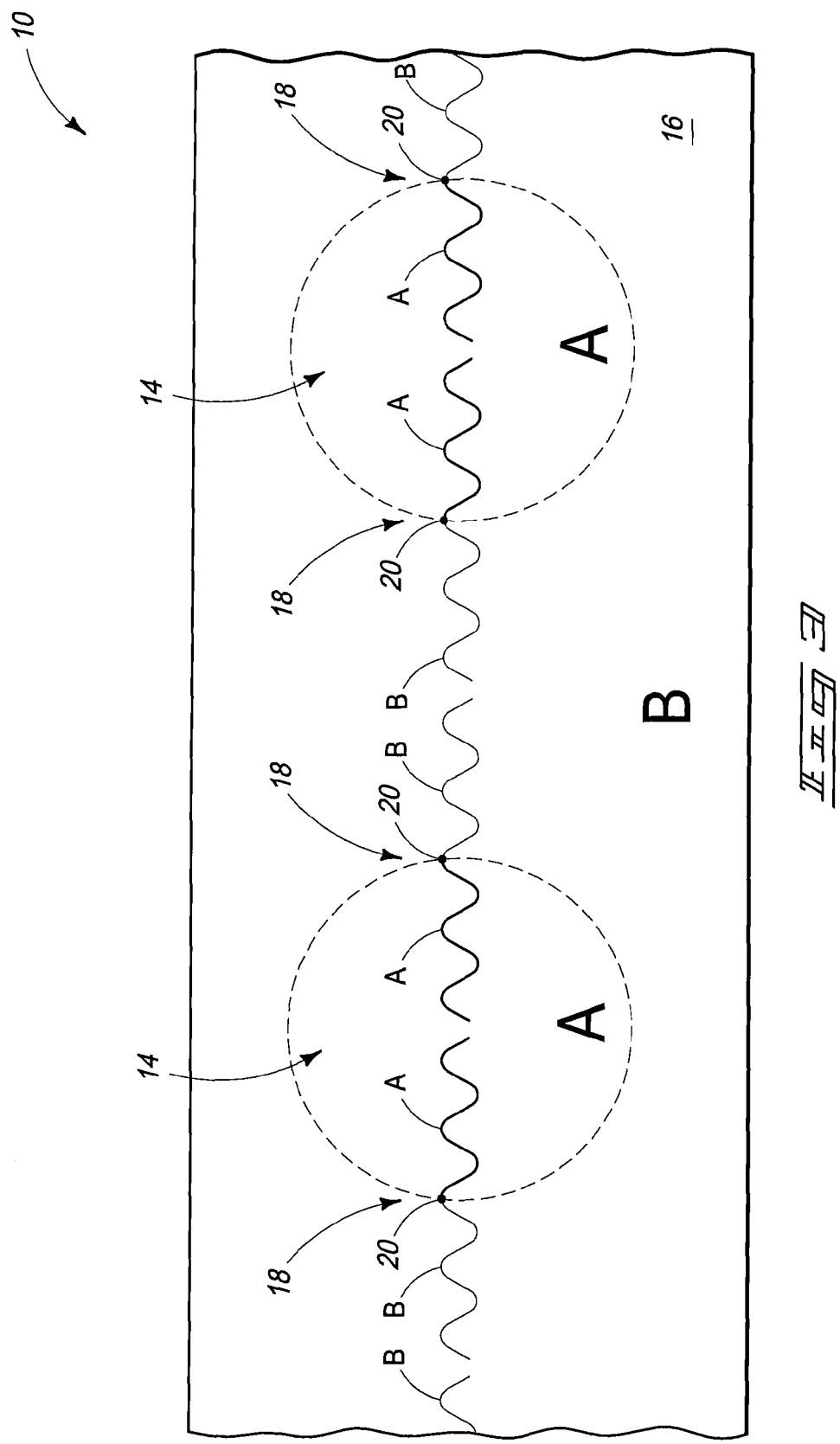
FIG. 3 is another diagrammatic representation of a portion of the pattern shown in FIG. 1.

FIG. 3 shows yet another way to illustrate the pattern of FIG. 1. Only a portion of the construction of FIGS. 1 and 2 is shown in FIG. 3; and the brush layer 17 (FIGS. 1 and 2) and substrate 12 (FIGS. 1 and 2) are not shown. A few separate diblock molecules 18 are diagrammatically illustrated in FIG. 3. Each diblock molecule has an A subunit (represented with a heavier line), a B subunit (represented with a lighter line) and a junction block connecting the A and B subunits to one another (the junction blocks are represented with knots 20 between the A and B subunits of individual molecules). The A subunits are shown interacting with one another to assemble into the domains 14, while the B subunits assemble into the domain 16.

Figure 4:
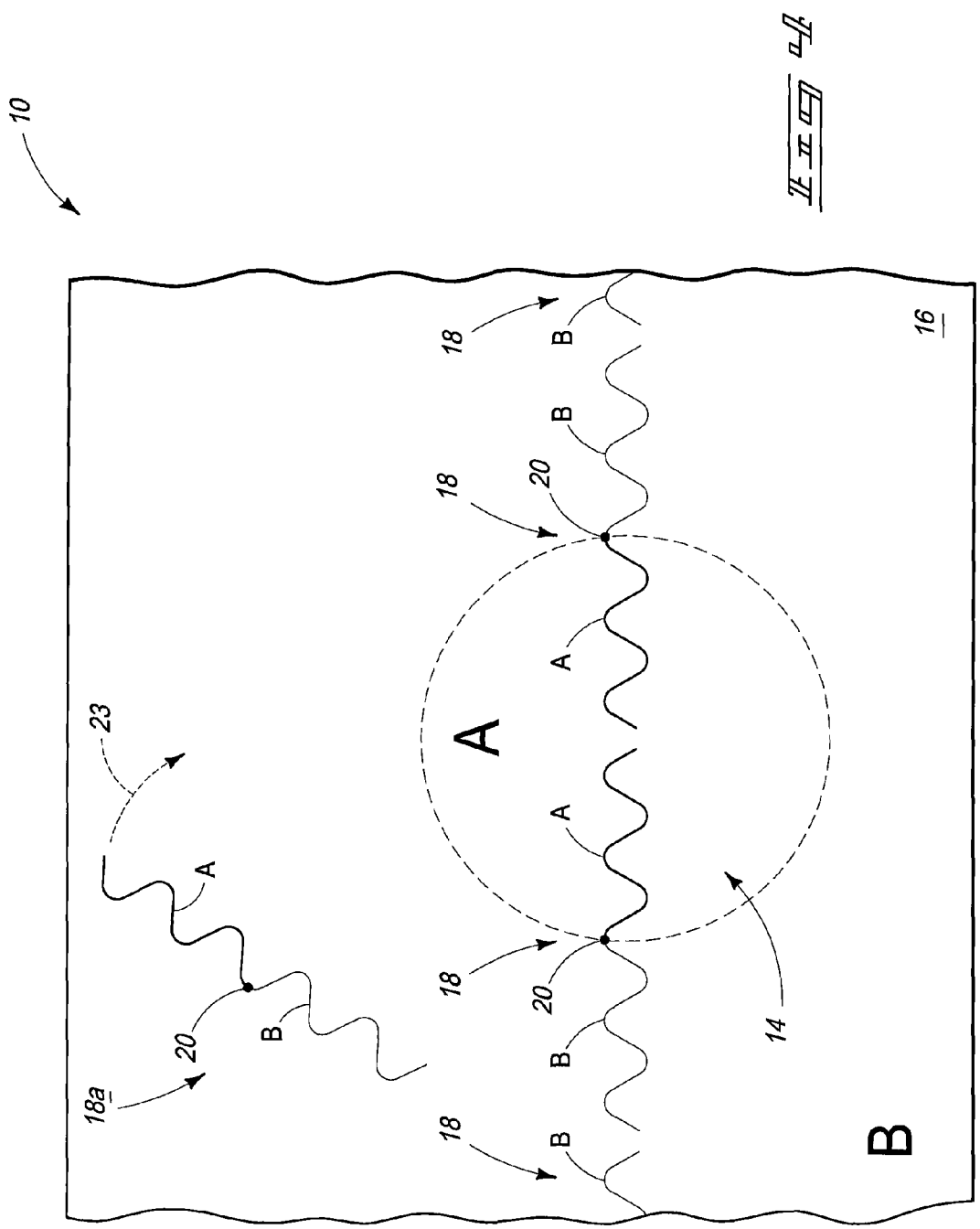
FIG. 4 is a diagrammatic representation of a step occurring during the self-assembly of block copolymer.

FIG. 4 shows an expanded region of the construction of FIG. 3 at an intermediate step during the assembly of domains 14 and 16. A diblock molecule 18a is shown migrating through a B subunit domain 16 during the self-assembly process (the migration is illustrated with the arrow 23). The movement of molecule 18a through domain 16 requires a substantial amount of energy because such movement includes moving the A subunit of molecule 18a through the B subunit domain 16. The Flory-Huggins interaction parameter X (Greek letter chi) may be used to characterize the difficulty of moving a diblock molecule 18a during a self-assembly process; with lower values of X indicating higher mobilities of diblock molecules through the various domains. The effective Flory-Huggins parameter ($X_{eff}$) may be related to temperature and solvent concentration through the relationship of Equation 1.

$$X_{eff} = \left(a + \frac{b}{T}\right)\Phi_p. \qquad \text{Equation 1}$$

In such relationship, a and b are material specific constants, T is the temperature (in Kelvins), and $\Phi_p$ is the volume fraction of polymer (specifically, block copolymer) in a composition containing both solvent and polymer. In other words $\Phi_p$ is related to the volumes of polymer ($V_p$) and solvent ($V_s$) in a block copolymer/solvent composition through the relationship of Equation 2.

$$\Phi_p = \frac{V_p}{V_p + V_s}. \qquad \text{Equation 2}$$

Equations 1 and 2 indicate that $X_{eff}$ may be decreased by increasing a temperature and/or by providing increasing amounts of solvent into the system (the solvent may be a single "neat" chemical composition [for instance, toluene], or may be a blend of chemical compositions [i.e., a so-called solvent blend]). There will be a range of conditions suitable for self-assembly of copolymer. Specifically, some temperatures will not be suitable for self-assembly of copolymer, either because the temperatures are below a glass transition temperature, $T_g$ (which is discussed below), or because the temperatures are above a degradation temperature, $T_d$, of the copolymer. Also, some solvent concentrations will not be suitable to induce self-assembly of the copolymer, either because the concentrations are too low to meaningfully affect $X_{eff}$, or because the solvent concentrations are so high that the product $X_{eff}*N$ (where N is the average number of monomer units per chain) drops below the threshold for transition from ordered to disordered states. This threshold varies depending on the volume fraction of the various individual blocks in the total block copolymer; but in theory is always ≥10.5, and in practice is usually at least 20. For at least the above-described reasons, a self-assembly process will have a range of suitable solvent concentrations, and a range of suitable temperatures.

The solvents utilized to induce self-assembly of block copolymer are generally solvents that interact with all of subunits of the block copolymer (for instance, solvents which interact with both subunits of a diblock copolymer). The solvents may be neutral-wetting relative to the subunits of the block copolymer (i.e., may have no preference for any subunit relative to another) or may exhibit some preference for one subunit relative to another. The relative preference of solvent for one subunit of block copolymer relative to other subunits may be estimated from Hildebrand or Hansen solubility parameters.

Figure 5:
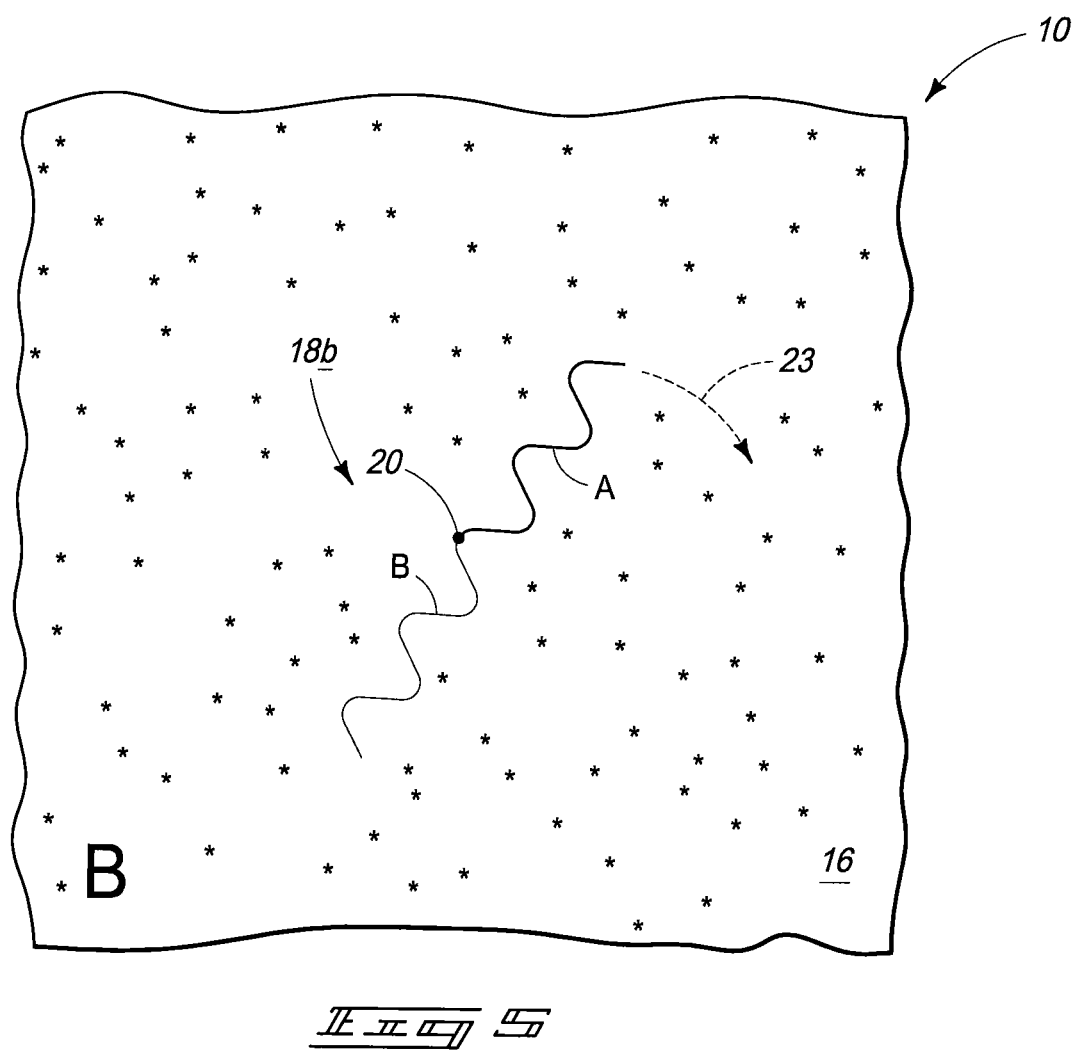
FIG. 5 is a diagrammatic representation of the utilization of solvent during the self-assembly of block copolymer.

FIG. 5 shows the construction of FIG. 4 in an embodiment in which solvent (diagrammatically illustrated with asterisks (*)) is within domain 16 to assist molecule 18b in moving through the domain 16. In some aspects, the solvent may be thought of as functioning analogously to a surfactant, and specifically as providing an interface between the A subunits of some copolymer molecules and the B subunits of other copolymer molecules to facilitate movement of different types of subunits past one another.

An aspect of some embodiments is recognition that it may be advantageous to utilize a combination of temperature and solvent concentration to tailor the effective Flory-Huggins interaction parameter, $X_{eff}$, of a block copolymer system. The tailoring of $X_{eff}$ may be utilized during the self-assembly of the block copolymer to achieve an assembled pattern; with such pattern having either no detectable defects, or having defects present to at or below a predetermined threshold. Such threshold may be established relative to a desired application of the pattern. For instance, if the pattern is to be utilized for fabrication of highly integrated circuitry, the threshold may be set at a level comparable to that expected for photolithographic patterning of photoresist masks; which may correspond to less than or equal to 0.3 defects per square centimeter of surface of the self-assembled copolymer.

In addition to X, block copolymers may also be characterized in terms of the glass transition temperature ($T_g$) of the block copolymers. The glass transition temperature of a block copolymer is the temperature at which the block copolymer melts; or, in other words, the temperature at which the block copolymer transforms from a "set" phase into a mobile phase. The set phase has characteristics of a solid (and may be, for example, a glassy solid), and the mobile phase has characteristics of a liquid (and may be, for example, a viscoelastic liquid). A block copolymer composition may have an intrinsic glass transition temperature ($T_{g,O}$) which is the glass transition temperature of the block copolymer in a pure (i.e., neat) state, in the absence of any solvent.

The glass transition temperature of a block copolymer composition may be influenced by solvent incorporation into the composition, and thus the composition may have a glass transition temperature other than $T_{g,O}$ if the composition has solvent incorporated therein. If a solvent interacts with all of the subunits of a block copolymer, the glass transition temperature will generally be inversely related to the solvent concentration in the composition containing the block copolymer and solvent. Thus, increasing the solvent concentration will decrease the glass transition temperature of the block copolymer/solvent composition.

In some embodiments, the self-assembly of block copolymer is conducted under particular process conditions, which include both a process temperature ($T_P$), and a process solvent volume ($V_{s,P}$) within the block copolymer/solvent composition. The block copolymer/solvent composition can have a glass transition temperature ($T_{g,P}$) under such process conditions, with $T_{g,P}$ being related to $V_{s,P}$; and with $T_{g,P}$ being less than the intrinsic glass transition temperature ($T_{g,O}$) of the block copolymer.

Although the glass transition temperature and $X_{eff}$ may be both influenced by solvent concentration, the glass transition temperature is a separate parameter from $X_{eff}$, and generally behaves independently of $X_{eff}$.

The process of forming a pattern with copolymer may involve the following steps in some embodiments. First, the copolymer is spread across a substrate. Next, the copolymer is subjected to appropriate conditions to induce self-assembly of a pattern within the copolymer; with any defects present in the pattern being present to at or below a predetermined threshold level of the defects. The self-assembled copolymer is then quenched to lock the pattern into a state that remains stable as the assembled block copolymer is transitioned to ambient conditions.

As discussed above, some embodiments utilize a combination of temperature and solvent concentration to tailor $X_{eff}$ during self assembly of block copolymer. Prior to discussing the embodiments that utilize the combination of temperature and solvent concentration, it is useful to discuss example processes that utilize temperature alone, or solvent alone, during self assembly of block copolymer.

Figure 6:
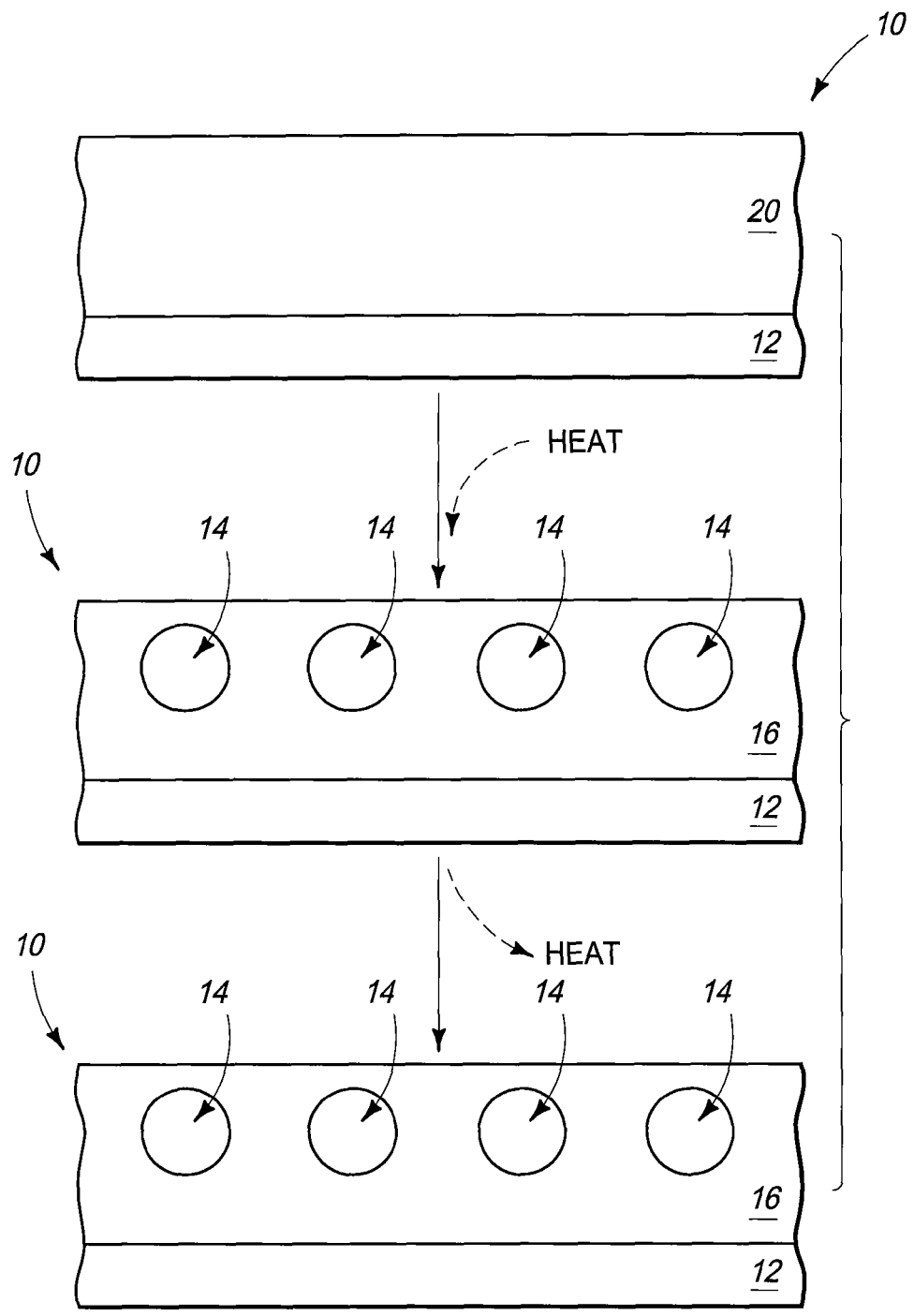
FIG. 6 diagrammatically illustrates thermal treatment of block copolymer to induce self-assembly within the block copolymer.

An example process of utilizing temperature treatment alone to form a self-assembled pattern within block copolymer is illustrated in FIG. 6. An initial step (shown at the top of the figure) comprises spreading block copolymer 20 over substrate 12. The construction 10 is then subjected to a thermal treatment (diagrammatically illustrated as the application of heat to the construction). The thermal treatment enables micro-phase separation and self-assembly of the copolymer to form the pattern comprising the domains 14 within the surrounding domain 16 (the brush layer is not labeled in FIG. 6, but would also be formed).

After the pattern of domains 14 and 16 is formed, the construction 10 is cooled to below $T_{g,O}$ (diagrammatically illustrated as removal of heat from the construction) to lock the pattern into place over the substrate 12.

The thermal processing of FIG. 6 will not work for some copolymer systems. For instance, some systems (like PS-b-PDMS) have too high of a $X_{eff}$ value to be processed with a thermal treatment alone, and $X_{eff}$ cannot be brought into a suitable regime for self-assembly of the copolymer at temperatures below the degradation temperature, $T_d$, of the copolymer. Temperatures above $T_d$ are not practical as they would degrade, or destroy, the copolymer.

An example process of utilizing a solvent treatment alone to form a self-assembled pattern within block copolymer is illustrated in FIG. 7. An initial step (shown at the top of the figure) comprises spreading the block copolymer 20 over the substrate 12 to form a film of the block copolymer across the substrate. The construction 10 is then subjected to solvent treatment (diagrammatically illustrated as the application of solvent vapor). The construction may be provided in a sealed chamber and the solvent treatment may comprise flowing solvent vapor into the chamber to achieve a desired partial pressure of solvent vapor within the atmosphere in the chamber. The amount of solvent incorporated into the block copolymer (or, in other words, the resulting volume fraction of solvent in the film) may be proportional to the partial pressure of the solvent vapor in the chamber atmosphere. The solvent incorporated into the copolymer is indicated in the figure with asterisks (*) representing the solvent. The solvent incorporation enables micro-phase separation and self-assembly of the copolymer to form the pattern comprising the domains 14 within the surrounding domain 16 (the brush layer is not labeled in FIG. 7, but would also be formed).

After the pattern of domains 14 and 16 is formed, the solvent is removed from within the assembled block copolymer (diagrammatically illustrated as removal of solvent vapor) to lock the pattern into place over the substrate 12.

FIG. 7 shows an idealized application in which solvent is utilized to form a desired self-assembled pattern within block copolymer. In practice, multiple problems may be confronted when attempting to utilize solvent and block copolymer to form patterns corresponding to monolayers of self-assembled structures. A couple of such problems are described with reference to FIGS. 8 and 9.

Figure 8B:
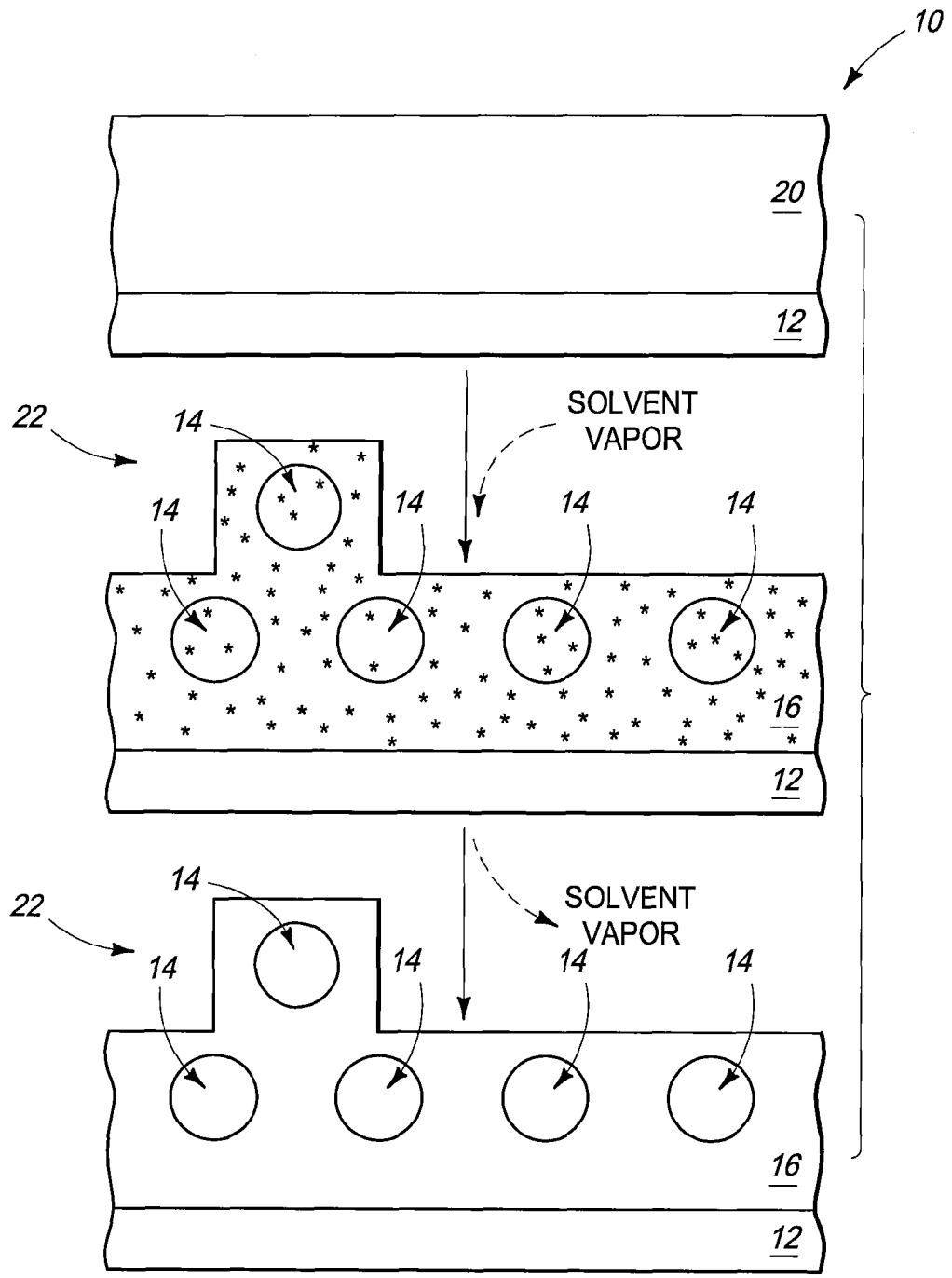
FIG. 8 diagrammatically illustrates solvent treatment of block copolymer to induce self-assembly within the block copolymer, and shows a problem that may occur during some processes.

FIG. 8 shows a process similar to that discussed above with reference to FIG. 7. However, the incorporation of solvent causes a substantial swelling volume change within the block copolymer, so that the resulting pattern of domains 14 and 16 is stacked into multiple layers, causing elevated regions 22 to be formed within the pattern of domains 14 and 16. In the shown application, the pattern of domains 14 and 16 is bifurcated into regions of n and n+1 layers of domains 14. In other applications, there may be regions of n+2 layers of domains 14, n+3 layers, etc., depending on the amount of a swelling induced by the incorporation of the solvent into the block copolymer. When the solvent is subsequently removed, the pattern may remain stacked into the multiple layers (as shown), or may collapse into a defect-ridden monolayer. Regardless, the pattern remaining after the solvent removal is not the desired single layer shown in FIG. 7.

Figure 9:
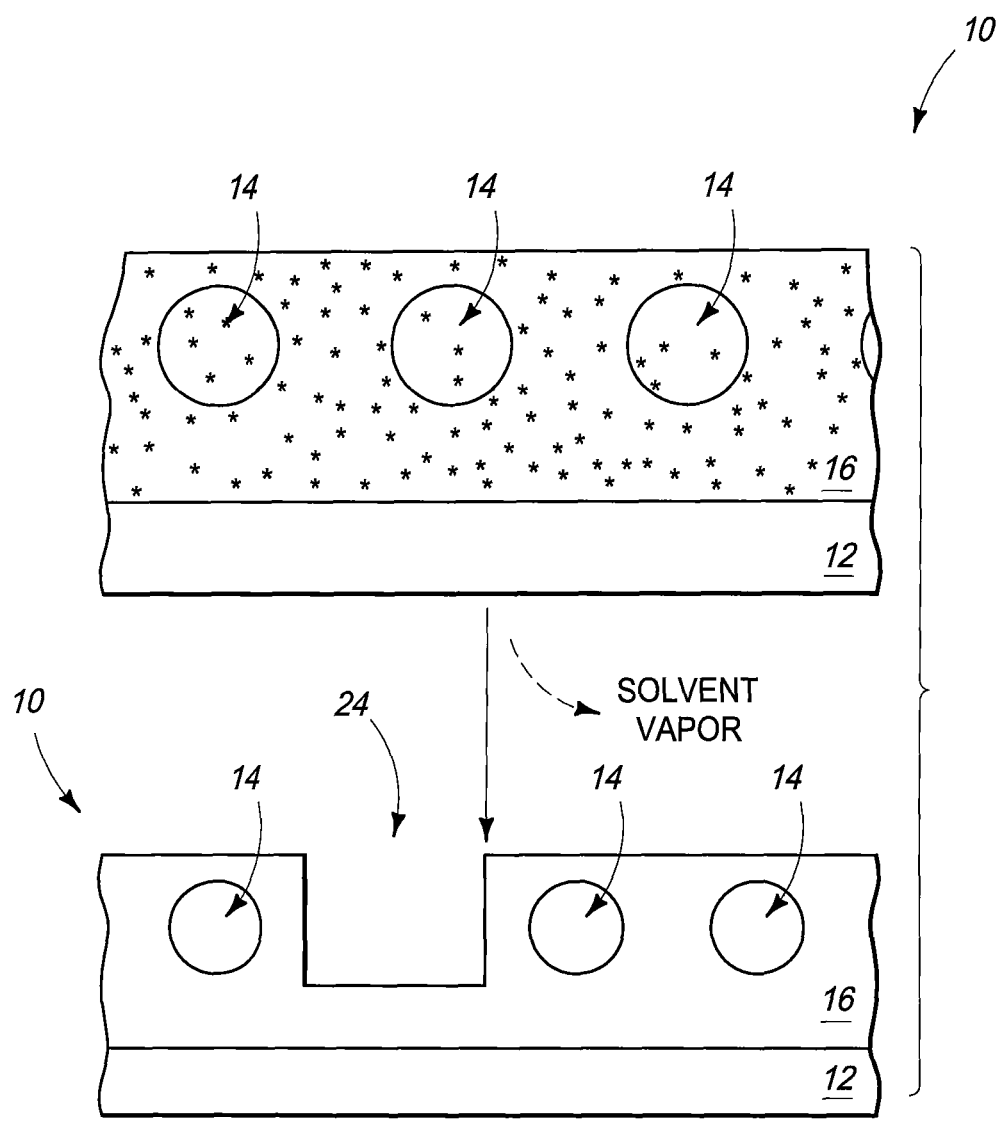
FIG. 9 diagrammatically illustrates removal of solvent from assembled block copolymer, and shows a problem that may occur during some processes.

FIG. 9 shows a problem that may occur as solvent is removed during the last stage of the FIG. 7 process. Specifically, as the solvent is removed the copolymer/solvent composition changes to a copolymer-only composition, with a corresponding decrease in volume. Such volume decrease leads to rupture of the self-assembled block copolymer, which is illustrated as formation of holes 24 within the pattern of domains 16 and 14. In the shown embodiment, the illustrated hole 24 penetrates to the brush layer (shown as 17 in FIG. 2), but not to the surface of substrate 12. In other embodiments, at least some of the holes may penetrate through the brush layer and to the upper surface of the substrate. FIG. 9 shows a pattern within domains 14 and 16 changing as the solvent is removed and the copolymer deswells. Specifically, both of domains 14 and 16 are expanded in the swollen pattern relative to the size of such domains in the deswollen pattern. Such effect may occur to some extent whenever solvent is utilized to induce self-assembly of block copolymer, but is not shown in the other drawings of this application in order to simplify the presentation of other concepts that are intended to be illustrated with such drawings. The magnitude of size change induced in domains 14 and 16 in proceeding from a deswollen state relative to a swollen state, or vice versa, may be reduced by reducing the volume fraction of solvent utilized to produce the swollen state.

The problems of FIGS. 8 and 9 may be alleviated, or even eliminated, by minimizing the amount of solvent, and subsequent volume change, utilized to induce self-assembly of block copolymer. Some of the embodiments described herein utilize a combination of thermal treatment and solvent treatment to induce self-assembly of block copolymer, with the thermal treatment being conducted at very high temperatures (i.e., temperatures close to the degradation temperature, $T_d$) so that the amount of solvent utilized for the solvent treatment may be kept at minimal levels. Also, the problem of FIG. 9 may be alleviated, or even eliminated, by using a small amount of solvent in combination with utilizing rapid quenching of a self-assembled pattern of block copolymer to lock the pattern into place. Some of the embodiments described herein utilize one or both of rapid cooling and rapid solvent removal for the rapid quenching utilized to lock the self-assembled pattern of block copolymer into place.

FIGS. 10-15 illustrate some example embodiments in which combinations of solvent treatment and thermal treatment are utilized during self-assembly of block copolymer, and/or in which rapid quenching is utilized to lock self-assembled block copolymer into the self-assembled configuration.

Figure 10:
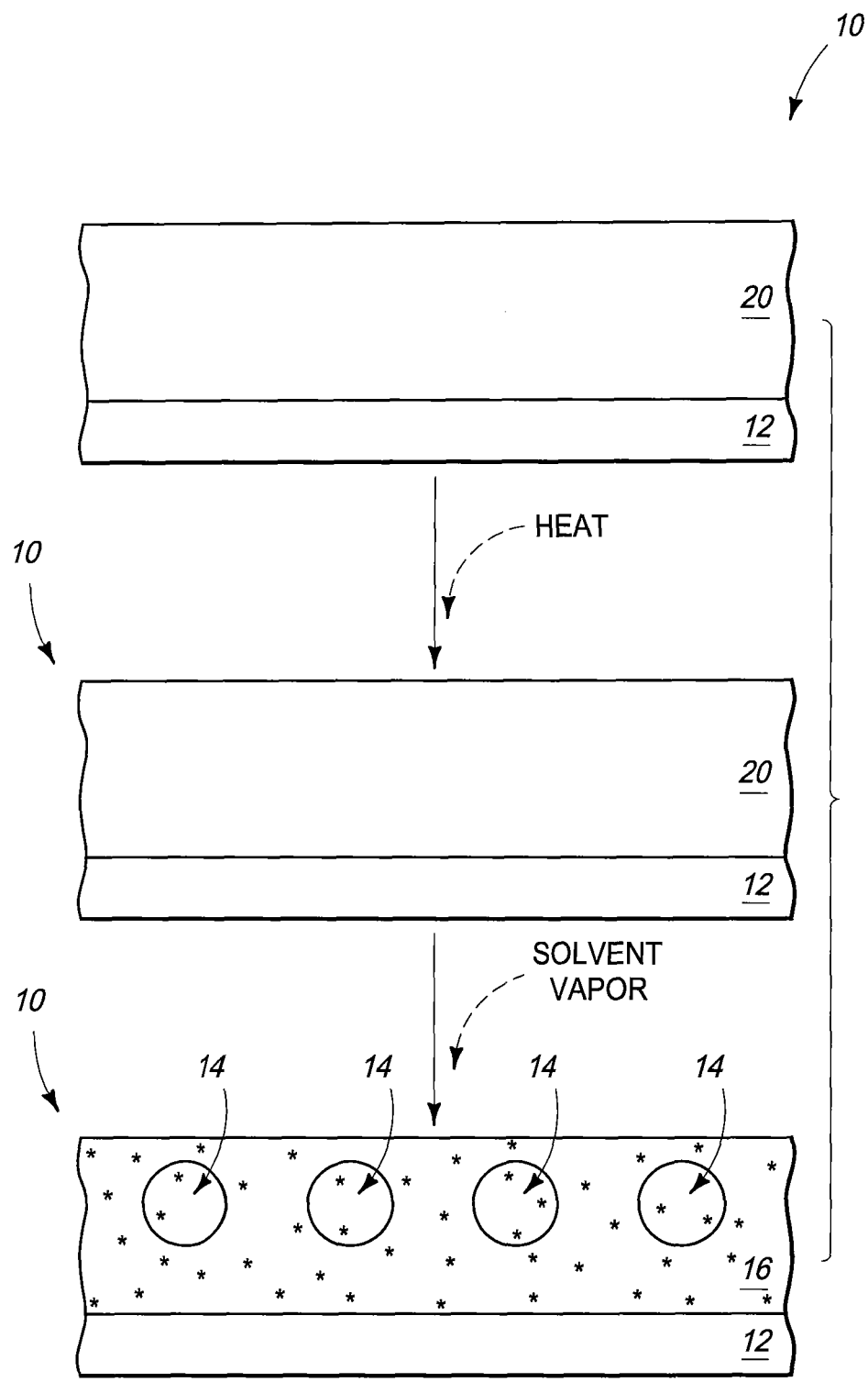
FIG. 10 diagrammatically illustrates an example embodiment process for utilizing a combination of thermal processing and solvent treatment to induce self-assembly within block copolymer.

Referring to FIG. 10, a construction 10 comprises a film of block copolymer 20 formed over a substrate 12. The block copolymer has an intrinsic glass transition temperature ($T_{g,o}$) and a degradation temperature ($T_d$). A temperature window is defined to be a range of temperature that is greater than or equal to $T_{g,o}$ and less than $T_d$. In other words, the temperature window comprises a range of temperatures (T) corresponding to $T_{g,o} \leq T < T_d$.

The block copolymer is exposed to thermal energy (represented in FIG. 10 as exposing the construction 10 to heat) to raise a temperature of the block copolymer. In some embodiments, it is desired to optimize the effective Flory-Huggins interaction parameter $X_{eff}$ during self-assembly of block copolymer so that the parameter is low enough to allow diffusion of the block copolymer molecules through the various domains established during self-assembly, and yet high enough so that an equilibrium defect concentration is within a predetermined tolerance. For instance, the tolerance for the defect concentration may be set to a limit suitable for highly integrated circuitry (which may be less than or equal to 0.3 defects per square centimeter of surface area, and in some applications may be less than or equal to 0.03 defects per square centimeter of surface area).

As discussed above, $X_{eff}$ may be decreased by increasing the temperature of a block copolymer composition and/or by increasing a solvent concentration within the block copolymer. However, the increase in the solvent concentration will lead to swelling and a corresponding change in volume in the block copolymer/solvent composition. Large volume changes can problematically induce defects of the type described with reference to FIGS. 8 and 9. Some embodiments include utilization of both temperature and solvent to induce self assembly of block copolymer to enable $X_{eff}$ to be tailored for the block copolymer systems, and use relatively high temperatures during the self-assembly to thereby reduce the amount of solvent utilized to achieve desired values of $X_{eff}$. In such embodiments, a process temperature utilized during self-assembly of block copolymer may be in the upper portion of the range corresponding to $T_{g,o} \leq T < T_d$. For instance, in some embodiments the process temperature may be in the upper half of such range, upper third of such range, upper quarter of such range, or upper tenth of such range.

While construction 10 is held at the process temperature, the block copolymer is exposed to solvent vapor to thereby introduce solvent into copolymer 20 (the solvent is diagrammatically illustrated as asterisks (*) in FIG. 10). The construction 10 may be retained within a chamber as it is held at the process temperature and exposed to the solvent vapor. The volume fraction of solvent ($V_s$ of equation 2) incorporated into copolymer 20 may be proportional to the partial pressure of solvent vapor within the chamber environment. In some embodiments, a minimal amount of solvent vapor is provided to initiate self-assembly within the block copolymer. The utilization of the minimal amount of solvent vapor may enable problems of the type described above with reference to FIGS. 8 and 9 to be avoided, and thus may enable the block copolymer to self assemble into a pattern of two or more domains (such as the illustrated pattern of domains 14 and 16 shown in FIG. 10) that has very few defects.

In some embodiments, $X_{eff}$ is tailored by using the combination of a high process temperature ($T_P$), and a low process solvent volume ($V_{s,P}$) during the self-assembly process. In specific embodiments, $X_{eff}$ may be tailored to achieve a number of defects corresponding to less than or equal to 0.3 defects per square centimeter of surface of the self-assembled block copolymer, or even less than or equal to 0.03 defects per square centimeter of surface of the self-assembled block copolymer. The processing of FIG. 10 can thus be utilized to achieve defect specifications of less than or equal to 0.3 defects per square centimeter, or even less than or equal to 0.03 defects per square centimeter.

Another way to quantitate the number of defects, rather than as a quantity per unit area, is to directly quantitate the number of defective units relative to the number of non-defective units. In some embodiments, $X_{eff}$ may be tailored through high temperature and low solvent concentration to achieve no more than one defective unit per one billion units of assembled block copolymer; with the term "unit" referring to a distinct domain region, such as the individual domain regions 14 of FIG. 10.

Figure 11:
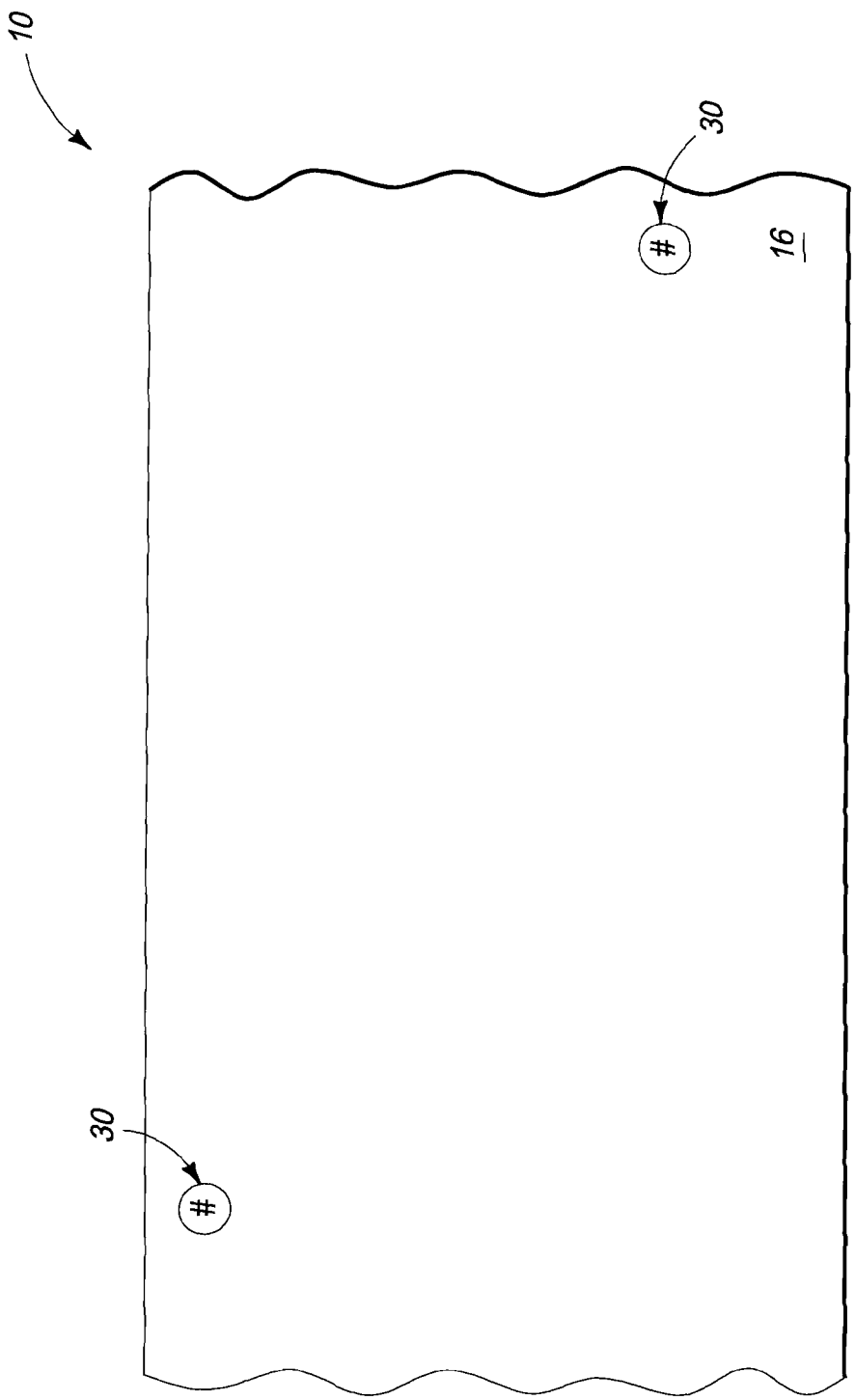
FIG. 11 diagrammatically illustrates a top view of an example construction treated in accordance with the embodiment of FIG. 10.

FIG. 11 shows a top view of the construction of FIG. 10, and diagrammatically illustrates defective units 30 present across an expanse of the self-assembled block copolymer. Such defective units may correspond to, for example, stacking regions of the type shown in FIG. 8, voids as shown in FIG. 9, or point defect patterns—such as dislocations. Conventional methods for self-assembly of block copolymer may lead to a relatively high number of defects across the expanse of self-assembled block copolymer. In contrast, embodiments described herein that induce self-assembly under conditions having relatively high temperatures in combination with low concentrations of solvent may eliminate defective units, or may at least reduce the number of defective units to within a tolerance suitable for fabrication of highly integrated circuitry.

The block copolymer and solvent utilized in the embodiment of FIG. 10 may be any suitable block copolymer and solvent. However, the embodiment of FIG. 10 may be particularly suitable for utilization with block copolymers that cannot be self-assembled utilizing thermal processing alone (e.g., block copolymers that have $X_{eff}$ values that are not reduced into a suitable regime for self-assembly at temperature values below the $T_d$ of the block copolymers). Among the block copolymer/solvent combinations that may be particularly suited for the embodiment of FIG. 10 is the combination of the block copolymer PS-b-PDMS and the solvent toluene.

The cross-sectional view of FIG. 10 shows the domains 14 as circles within the domain 16. In some embodiments the domains 14 may be cylinders that extend parallel to an upper surface of substrate 12, and that extend in and out of the page relative to the cross-sectional view of FIG. 10 to form a monolayer pattern across substrate 12 (with the monolayer pattern being a single layer of domains 14 across the substrate as opposed to the problematic n+1 layer patterns described above with reference to FIG. 8). In other embodiments, the domains 14 may be spherical micelles. If the domains 14 are spherical micelles, they may be in a two-dimensional arrangement across the upper surface of substrate 12, with such arrangement corresponding to, for example, hexagonal closest packed unit cells or cubic unit cells forming a monolayer pattern across substrate 12.

After the self-assembly of the block copolymer of FIG. 10, the solvent may be removed to leave the patterned domains of the assembled block copolymer. One of the problems with prior art methods of solvent removal is that film rupturing, or other defects, may occur during the deswelling that accompanies removal of the solvent from the film. For instance, FIG. 9 describes a problem of hole formation accompanying solvent removal.

In some embodiments, the removal of solvent from assembled block copolymer is accomplished under conditions which alleviate, or may even eliminate, defect formation during the solvent removal. Such conditions may include removal of the solvent after very rapidly reducing a temperature of the self-assembled block copolymer to a temperature less than $T_{g,P}$ of the block copolymer, and/or very rapid removal of the solvent from the self-assembled block copolymer. It can be preferred that the removal of the solvent be accomplished while maintaining a desired defect specification within the assembled block copolymer. Thus, in some embodiments the solvent is removed while maintaining a defect specification of less than or equal to 0.3 defects per square centimeter of the assembled block copolymer, or even of less than or equal to 0.03 defects per square centimeter of the assembled block copolymer.

Figure 12:
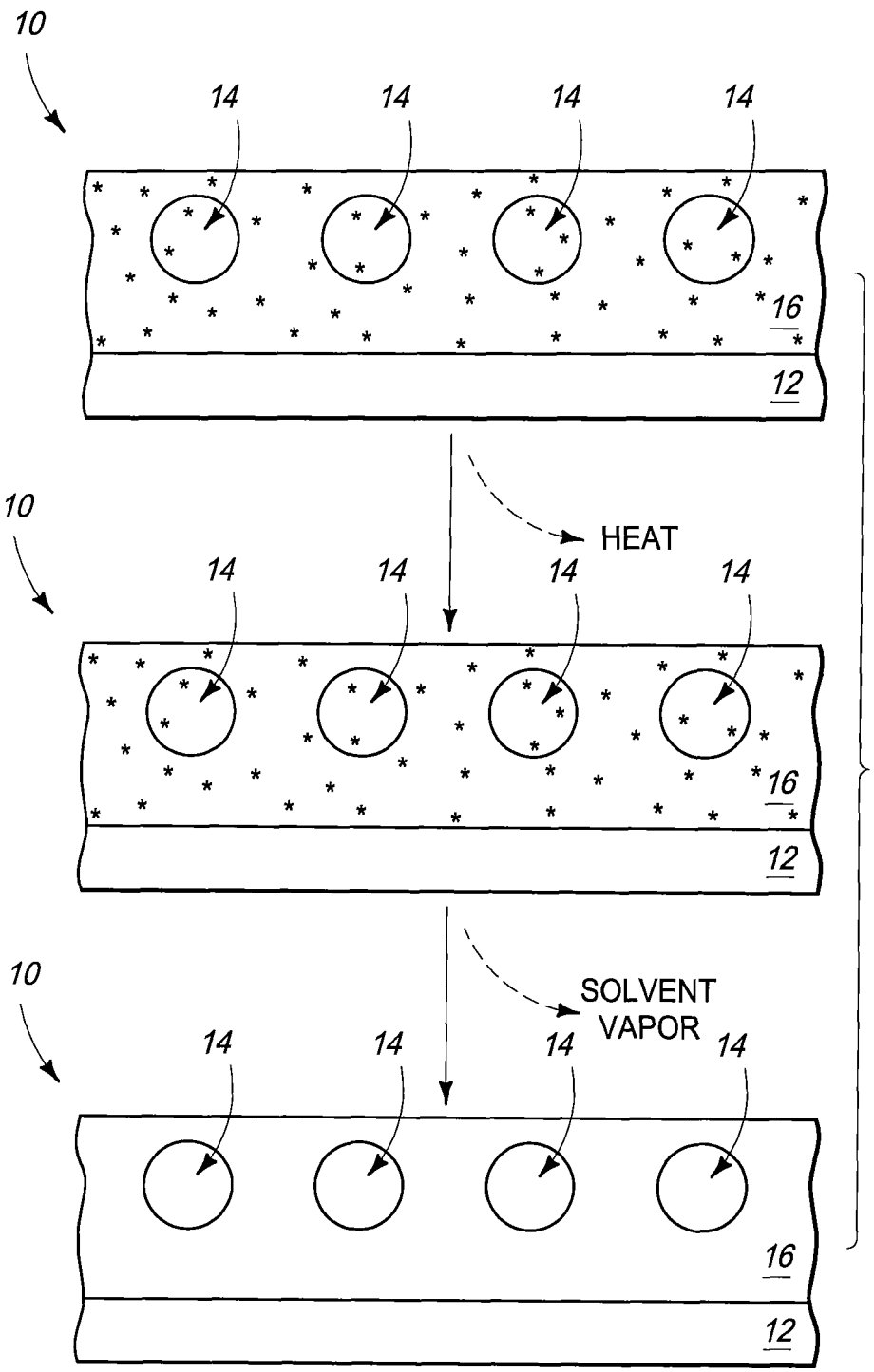
FIG. 12 diagrammatically illustrates an example embodiment process for removing solvent from an assembled block copolymer.

FIG. 12 illustrates example processing for removal of solvent from self-assembled block copolymer by utilizing a temperature change prior to the solvent removal. The top construction of FIG. 12 may correspond to the construction formed by the processing of FIG. 10. At an initial step of FIG. 12 the construction 10 is cooled (diagrammatically illustrated by heat removal from the construction). The cooling may comprise very rapid cooling of the block copolymer to a temperature below $T_{g,P}$ to lock the copolymer into the self-assembled configuration. The rapid cooling may be accomplished by retaining construction 10 on a thermally-controlled chuck, and then rapidly reducing a temperature of the chuck to thereby rapidly reduce the temperature of the block copolymer. In other embodiments, the rapid cooling may comprise transferring the construction 10 onto a surface that has been pre-equilibrated to a temperature below $T_{g,P}$. Alternatively, or additionally, the block copolymer may be cooled by providing the construction 10 within a chamber, and flowing cold gas (i.e., gas at a temperature below $T_{g,P}$) through such chamber to rapidly cool the block copolymer. The rate of cooling of the block copolymer with the gas may depend on the temperature of the gas (with lower temperatures leading to faster cooling) and the flow rate of the gas (with faster flow rates leading to faster cooling). In some embodiments, the gas may be flowed at a rate of at least about 1 chamber volume per second, and/or may be provided at a temperature that is at least about 50° C. below $T_{g,P}$.

In some embodiments, the rapid cooling of the block copolymer may comprise cooling the block copolymer at a rate of at least about 10° C./second, at least about 60° C./second, or even at least about 100° C./second. In some embodiments, the rate of cooling is within a range of from about 10° C./second to about 60° C./second. The rapid cooling of the block copolymer may be referred to as thermal quenching of the block copolymer in some embodiments. The term "thermal quenching" refers to the quenching of rearrangement of the pattern of the block copolymer by cooling the block copolymer to a temperature below $T_{g,P}$.

After construction 10 is cooled, and while keeping the assembled block copolymer at a temperature below $T_{g,P}$, the solvent is removed from the block copolymer (diagrammatically illustrated in FIG. 12 as removal of solvent vapor). The solvent may be removed with any suitable method. For instance, the solvent may be removed by subjecting construction 10 to vacuum. Alternatively, the solvent may be removed by flushing non-solvent-containing purge gas across construction 10. In some embodiments, the solvent may be removed by flushing non-solvent-containing purge gas across construction 10 while exposing the construction to a partial vacuum.

Figure 13:
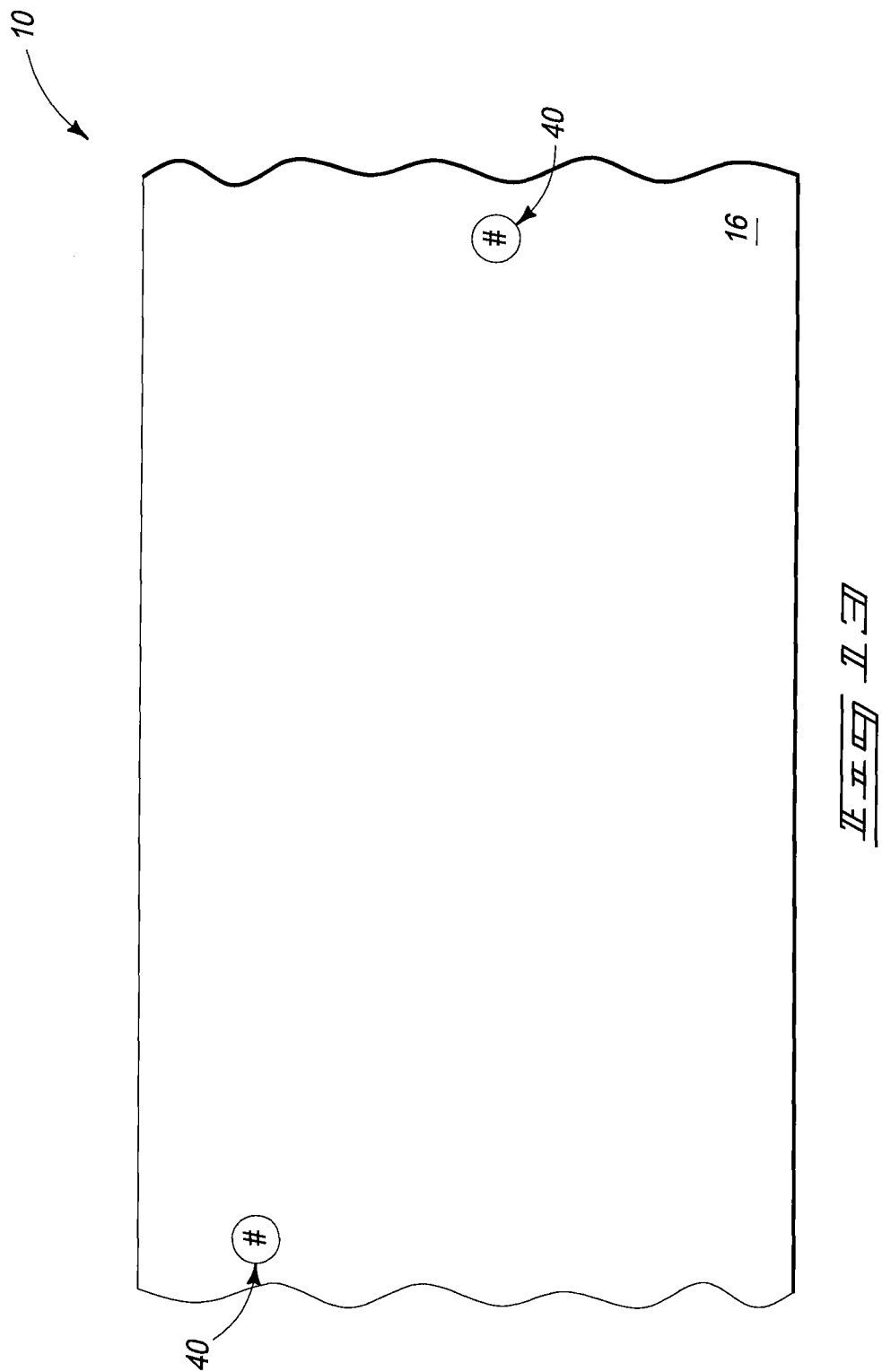
FIG. 13 diagrammatically illustrates a top view of an example construction treated in accordance with the embodiment of FIG. 12.

FIG. 13 shows a top view of the construction 10 after the processing of FIG. 12, and diagrammatically illustrates defective units 40 present across an expanse of the self-assembled block copolymer. Conventional methods for removing solvent from assembled block copolymer may lead to a relatively high number of defects across the expanse of self-assembled block copolymer. In contrast, the embodiments described herein that remove solvent after first rapidly reducing the temperature to below $T_{g,P}$ may eliminate defective units, or may at least reduce the number of defective units to within a tolerance suitable for fabrication of highly integrated circuitry.

Once the solvent is removed, the self-assembled pattern within the block copolymer is stable at temperatures below $T_{g,O}$. The patterned domains within the self-assembled block copolymer may be subsequently utilized to impart a pattern into the underlying substrate 12. For instance, one of the patterned domains may be selectively removed, or otherwise altered, relative to the other to form a patterned mask over substrate 12. Such patterned mask may be utilized during a subsequent etch to pattern structures formed in substrate 12, and/or during a subsequent dopant implant to pattern dopant regions formed in substrate 12.

FIG. 12 illustrates an embodiment in which block copolymer is rapidly cooled prior to solvent removal in order to lock the block copolymer into a self-assembled pattern. In other embodiments, the solvent may be rapidly removed in order to lock the block copolymer into the self-assembled pattern. The removal of the solvent raises the glass transition temperature $T_g$ of the copolymer composition from $T_{g,P}$ to $T_{g,O}$. Since the self-assembly process is at the process temperature $T_p$, the removal of the solvent raises the glass transition temperature to value higher than the temperature of the block copolymer, and thereby ceases further changes within the self-assembled block copolymer. The rapid solvent removal may be conducted without first reducing a temperature of the block copolymer to less than $T_P$ in some embodiments, and in other embodiments may be conducted after first reducing a temperature of the block copolymer to less than $T_P$.

FIG. 14 illustrates construction 10 at a processing stage subsequent to that of FIG. 10, and shows solvent being rapidly removed from the construction (diagrammatically illustrated as rapid removal of solvent vapor). The rapid removal of the solvent may be accomplished by rapidly flowing multiple chamber volumes of non-solvent-containing purge gas through a chamber containing construction 10 therein. For instance, in some embodiments at least 10 chamber volumes of non-solvent-containing purge gas may be flowed through the chamber at a rate of at least about 1 chamber volume per second. The purge gas may comprise any suitable composition or combination of compositions, and in some embodiments may comprise, consist essentially of, or consist of one or more of argon, carbon dioxide and nitrogen. In some embodiments, the rate of flow of the purge gas through the chamber may be faster than 1 chamber volume per second, and may be, for example, at least about 10 chamber volumes per second.

The purge gas utilized to remove solvent may be at any suitable temperature. In some embodiments, the removal of the solvent increases the block copolymer glass transition temperature $T_g$ to a value much higher than $T_{g,P}$. In such embodiments, the purge gas may be heated relative to the process temperature utilized during the self-assembly of the block copolymer without inducing detrimental glass flow within the block copolymer. The heating of the purge gas may enhance the rate of removal of solvent. Alternatively, the purge gas may be cooled relative to the process temperature utilized during the self-assembly of the block copolymer in order to ensure that the temperature of the block copolymer remains below the glass transition temperature of the block copolymer during the removal of the solvent.

The solvent removal may include utilization of partial vacuum in addition to the sweep of purge gas through the chamber in some embodiments; and in other embodiments the solvent removal may comprise utilization of vacuum without utilization of purge gas.

FIG. 15 shows a top view of the construction after the processing of FIG. 14, and diagrammatically illustrates defective units 50 present across an expanse of the self-assembled block copolymer. Conventional methods for removing solvent from assembled block copolymer may lead to a relatively high number of defects across the expanse of self-assembled block copolymer. In contrast, embodiments described herein that remove rapidly remove solvent may eliminate defective units, or may at least reduce the number of defective units to within a tolerance suitable for fabrication of highly integrated circuitry.

As discussed above, the patterned block polymers formed by the various embodiments described herein may be utilized to pattern underlying semiconductor substrates. In some embodiments such semiconductor substrates may be then incorporated into electronic systems. The electronic systems may be any suitable systems, including systems of the broad range that includes clocks, televisions, cell phones, personal computers, automobiles, industrial control systems, and aircraft.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a pattern, comprising:
   forming a film of di-block copolymer over an upper surface of a substrate in an absence of solvent; the block copolymer having an intrinsic glass transition temperature ($T_{g,O}$) and having a degradation temperature ($T_d$); a temperature window being defined as a range of temperature that is greater than or equal to $T_{g,O}$ and less than $T_d$; and initiating exposure of the block copolymer to thermal energy;
   after the initiating and while the block copolymer is within the upper half of the temperature window, providing solvent into the block copolymer to a volume fraction that will induce self-assembly of the block copolymer into a pattern comprising two or more domains; the self-assembled block copolymer having less than a predetermined number of defects.

2. The method of claim 1 wherein the solvent is a single chemical composition.

3. The method of claim 1 wherein the solvent is a blend of two or more chemical compositions.

4. The method of claim 1 wherein the solvent volume fraction induces no more than 0.3 defects per square centimeter of surface of the self-assembled block copolymer.

5. The method of claim 1 wherein the solvent volume fraction induces no more than 0.03 defects per square centimeter of surface of the self-assernbled block copolymer.

6. The method of claim 1 wherein the block copolymer is PS-b-PDMS and the solvent is toluene.

7. The method of claim 1 further comprising, after inducing the self-assembly, removing the solvent from within the block copolymer.

8. The method of claim 1 further comprising, after inducing the self-assembly, removing the solvent from within the block copolymer under conditions which leave the block copolymer in a self-assembled pattern having no more than the predetermined number of defects per unit area.

9. The method of claim 1 further comprising, after inducing the self-assembly, removing the solvent from within the block copolymer under conditions which leave the block copolymer in a self-assembled pattern having no more than 1 defect per one billion units.

10. The method of claim 9 wherein the block copolymer has a process glass transition temperature $T_{g,P}$ at the solvent volume fraction utilized during the inducement of the self-assembly, and wherein the conditions used during the solvent removal include cooling the assembled block copolymer at a rate of at least about 10° C./second to a temperature below $T_{g,P}$ and then removing the solvent from the block copolymer while the temperature of the block copolymer remains below $T_{g,P}$.

11. The method of claim 9 wherein the conditions include removing the solvent from the block copolymer by sweeping at least 10 chamber volumes of non-solvent-containing purge gas through the chamber at a rate of at least about 1 volume per second.

12. A method of forming a pattern, comprising:
   forming a block copolymer film over an upper surface of a substrate in an absence of solvent, the block copolymer being a di-block copolymer; the block copolymer having an intrinsic glass transition temperature ($T_{g,O}$) and having a degradation temperature ($T_d$); a temperature window being defined to correspond to temperatures (T) within a range of $T_{g,O} \leq T < T_d$;

initiating exposure of the block copolymer to thermal energy;

after the initiating and while the block copolymer is in the upper half of the temperature window, providing solvent into the block copolymer to a process volume fraction that will induce self-assembly of the block copolymer into a pattern comprising two or more domains; a defect specification being defined to be less than or equal to 0.3 defects per square centimeter of surface of the self-assembled block copolymer; the process volume fraction being at a level that achieves self-assembly within the defect specification; and after inducing the self-assembly, removing the solvent while maintaining the defect specification.

13. The method of claim 12 wherein the self-assembly forms a monolayer of cylinders that extend parallel to the upper surface of the substrate.

14. The method of claim 12 wherein the self-assembly forms a monolayer of a two-dimensional array of spherical micelles across an upper surface of the substrate.

15. The method of claim 12 wherein the defect specification is less than or equal to 0.03 defects per square centimeter of surface of the self-assembled block copolymer.

16. The method of claim 12 wherein the block copolymer has a process glass transition temperature $T_{g,P}$ at the process volume fraction of solvent utilized during the inducement of the self-assembly, and wherein the solvent is removed under conditions which include cooling the assembled block copolymer at a rate of at least about 10° C./second to a temperature below $T_{g,P}$ and then removing the solvent from the block copolymer while the temperature of the block copolymer remains below $T_{g,P}$.

17. The method of claim 12 wherein the solvent is removed under conditions which include sweeping at least 10 chamber volumes of non-solvent-containing purge gas through the chamber at a rate of at least about 1 volume per second.

18. A method of forming a pattern, comprising:

forming a block copolymer film over an upper surface of a substrate, the block copolymer being a di-block copolymer;

initiating exposure of the block copolymer to thermal energy;

after the initiating, providing solvent into the block copolymer to a volume fraction that will induce self-assembly of the block copolymer into a pattern comprising two or more domains; the block copolymer having a process glass transition temperature $T_{g,P}$ at the volume fraction of solvent utilized during the inducement of the self-assembly;

after inducing the self-assembly, thermally quenching the self-assembled block copolymer to a temperature below $T_{g,P}$; the thermal quenching comprising a reduction in temperature of the block copolymer at a rate of at least about 10° C./second; and after the thermal quenching, removing the solvent.

19. The method of claim 18 wherein the rate is at least about 60° C./second.

20. The method of claim 18 wherein the rate is at least about 100° C./second.

21. The method of claim 18 wherein the thermal quenching is conducted while the block copolymer and substrate are within a chamber, and wherein the thermal quenching comprises flowing gas through the chamber, the gas being at a temperature below said $T_{g,P}$ as the gas is flowed into the chamber.

22. The method of claim 18 wherein the thermal quenching is conducted while the block copolymer and substrate are within a chamber, wherein the substrate is supported by a temperature-controlled chuck, and wherein the thermal quenching comprises cooling the chuck to a temperature below $T_{g,P}$.

23. The method of claim 18 wherein the thermal quenching comprises transferring the block copolymer and substrate onto a surface that is at a temperature below $T_{g,P}$.

24. The method of claim 18 wherein the thermal quenching is conducted while the block copolymer and substrate are within a chamber, and further comprising drawing vacuum within the chamber during the removal of the solvent.

25. The method of claim 18 wherein the thermal quenching is conducted while the block copolymer and substrate are within a chamber, and further comprising flowing non-solvent-containing purge gas through the chamber during the removal of the solvent.

26. The method of claim 18 wherein the thermal quenching is conducted while the block copolymer and substrate are within a chamber, and further comprising flowing non-solvent-containing purge gas through the chamber at a rate of at least about 1 chamber volume per second of the purge gas during the removal of the solvent.

27. A method of forming a pattern, comprising:

forming a block copolymer film over an upper surface of a substrate, the block copolymer being a di-block copolymer;

initiating exposure of the block copolymer to thermal energy within the chamber;

after the initiating and while the block copolymer and underlying substrate are in the chamber, providing solvent into the block copolymer to a volume fraction that will induce self-assembly of the block copolymer into a pattern comprising two or more domains;

after inducing the self-assembly, removing the solvent from the block copolymer with vacuum; and wherein the block copolymer has an intrinsic glass transition temperature ($T_{g,O}$) and has a degradation temperature ($T_d$); wherein a temperature window is defined to correspond to temperatures (T) within the range of $T_{g,O} \leq T < T_d$; and wherein the block copolymer is in the upper half of said temperature window during the inducement of the self-assembly.

* * * * *

UNITED STATES PATENT AND TRADEMARK OFFICE
CERTIFICATE OF CORRECTION

PATENT NO. : 8,696,918 B2  Page 1 of 1
APPLICATION NO. : 12/774581
DATED : April 15, 2014
INVENTOR(S) : Dan Millward et al.

It is certified that error appears in the above-identified patent and that said Letters Patent is hereby corrected as shown below:

On the Title Page Item (56), under "Other Publications", in column 2, line 10, delete "this" and insert -- thin --, therefor.

In the Claims

In column 12, line 34, in Claim 5, delete "self-assernbled" and insert -- self-assembled --, therefor.

In column 12, line 51, in Claim 10, delete "$T_{g,p}at$" and insert -- $T_{g,p}$ at --, therefor.

Signed and Sealed this
Twenty-second Day of July, 2014

Michelle K. Lee
*Deputy Director of the United States Patent and Trademark Office*